Aug. 14, 1956

H. K. JENNY 2,759,122

TUNABLE MAGNETRON

Filed Oct. 1, 1954

INVENTOR.
HANS K. JENNY
BY
Charles H. Brown
ATTORNEY

United States Patent Office 2,759,122

Patented Aug. 14, 1956

2,759,122

TUNABLE MAGNETRON

Hans K. Jenny, Whippany, N. J., assignor to Radio Corporation of America, a corporation of Delaware Application October 1, 1954, Serial No. 459,680

4 Claims. (Cl. 315—39.57)

Figures 1, 2:
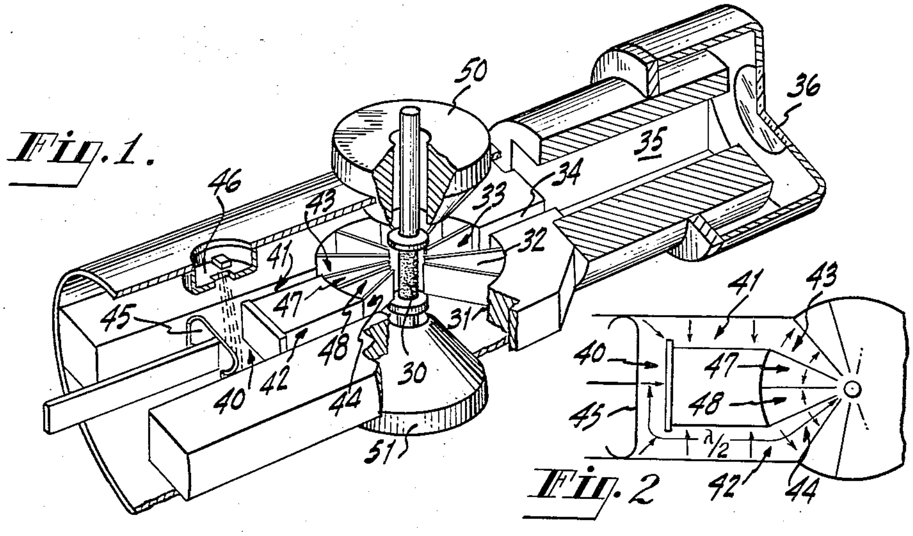

This invention relates to ultra-high frequency electron discharge devices of the magnetron type, and more particularly to mechanically and electronically tunable magnetrons.

The frequency of oscillation of a cavity resonator magnetron may be mechanically tuned or adjusted by varying the physical configuration in the anode block cavity resonator structure, or by varying the size of a separate tuning cavity resonator coupled to one resonator in the anode block. The frequency of oscillation of a magnetron may also be varied by directing a modulated electron beam thru one or more of the anode block cavity resonator or thru a separate cavity resonator coupled to one resonator in the anode block. A magnetron tuned by means of a separate tuning cavity resonator is generally much easier and less expensive to manufacture than one wherein the tuning is effected in the anode block cavity resonator structure. However, a separate tuning cavity resonator coupled to one resonator in the anode block permits of a limited range of tuning which cannot be exceeded without disturbing the electrical symmetry within the anode block and causing unstable operation.

An object of this invention is to provide an improved tunable magnetron which may be tuned over a greater range than has heretofore been possible without adversely affecting the electrical symmetry within the anode block.

It is often desired to provide a magnetron for generating a radio frequency wave that can be frequency modulated with intelligence at a high rate by means of an electron beam directed thru a tuning cavity resonator coupled to the magnetron. The tuning cavity resonator is made mechanically adjustable to permit tuning of the magnetron to the desired center frequency. A disadvantage encountered with prior arrangements is that changes in the position of the mechanical tuning means results in a change in the electric field strength in the region traversed by the electron beam. Therefore, the modulating efficiency of the electron beam varies with the frequency to which the magnetron is tuned by means of the mechanical tuner.

Another object of this invention is to provide an improved mechanically and electronically tunable magnetron wherein the effectiveness of the electron beam is independent of the mechanical tuning of the tuning cavity resonator.

The invention comprises a magnetron having a single tuning cavity resonator coupled to two cavity resonators in the anode block. An electron beam is directed thru the tuning cavity resonator to permit frequency modulation of the magnetron output. The center frequency of the magnetron is adjusted by adjusting the position of a tuning plunger defining one wall of the tuning cavity resonator. The arrangement is such that the location of the point of maximum radio frequency field strength in the region of the cavity resonator traversed by the electron beam is not affected by the position of the tuning plunger.

These and other objects and aspects of the invention will appear from the following more detailed description taken in conjunction with the appended drawings, wherein:

Figure 1 is a perspective cut-away view of a mechanically and electronically tunable magnetron according to this invention; and Figure 2 is a diagrammatic representation of the magnetron of Figure 1.

Referring to Figure 1, there is shown a plural cavity resonator tunable magnetron which includes a tubular cathode 30 which is heated by means of an internal filament (not shown). A metallic block structure is symmetrically and coaxially arranged around the longitudinal axis of the cathode 30. The anode block includes the cylindrical conductive wall 31 from which a plurality of conductive vanes 32 extend radially toward the cathode 30 to define a plurality of anode cavity resonators 33 in communication with each other thru the space in the region of the cathode 30.

One of the anode resonators 33 is coupled thru an output transformer 34 to an output waveguide 35. The end of the waveguide 35 is provided with an iris window 36 thru which the radio frequency energy passes toward a utilization device, the window 36 being part of the envelope of the magnetron.

A tuning cavity resonator 40 is coupled at two opposite ends 41 and 42 to the outer ends of anode resonators 43 and 44, respectively, within the anode block. The electrical length of the tuning cavity 40 is adjustably determined by means of a tuning plunger 45 located opposite from the anode block and in mechanical and electrical engagement with opposite sides of the cavity 40. Tuning plunger 45 thus constitutes one wall of cavity resonator 40.

The tuning cavity resonator 40 is a folded or U-shaped section of transmission line open at the ends coupled to the anode resonators 43 and 44, and is arranged so that the electrical distance from the inner end of anode resonator 43 thru the coupling 41, thru the cavity resonator 40, thru the coupling 42, and to the inner end of anode resonator 44 is equal to one wavelength at the center of the operating range of the magnetron. If the electrical length of each of the anode resonators is a quarter wavelength, the electrical length of the tuning resonator 40 itself would be a half wavelength. With this arrangement, the electric field strength is a maximum at the center of the tuning cavity resonator 40. The center of the tuning cavity resonator 40 is traversed by an electron beam from an electron gun 46. It is apparent that the symmetry of the tuning cavity resonator is such that the tuning plunger 45 does not shift the point of maximum field strength in the cavity resonator 40 away from the region thru which the electron beam passes, as is the case with prior arrangements.

It will be noted that the anode resonators 43 and 44 which are coupled to the tuning cavity resonator are separated by two anode resonators 47 and 48. The tuning cavity resonator should be coupled to two anode resonators which are immediately adjacent to each other or which are separated by an even number of intermediate anode resonators. This results from the fact that adjacent anode resonators have electric fields extending in opposite directions at any given instant of time. Two reversals in the direction of the electric field occur in going around the tuning circuit loop between the two resonators in the anode block. This is illustrated schematically in Figure 2 of the drawings.

The tunable magnetron also includes permanent magnets (not shown) for establishing a magnetic field thru pole pieces 50 and 51, and thru the resonators of the magnetron; and leads for applying polarizing potentials as is well-known in the art. Annular straps normally used for increasing the coupling between the magnetron resonators have been omitted from the drawing for reasons of clarity of illustration. While vane type magnetrons are shown in the drawings, it will be understood that hole-and-slot and rising-sun type magnetrons are equally applicable.

According to this invention there is provided an improved mechanically tunable magnetron having a tuning cavity resonator symmetrically coupled to a plurality of cavity resonators in the anode block. By this arrangement the tuning cavity resonator is more effective in controlling the frequency of oscillation of the magnetron, and the effect of the tuning cavity resonator is distributed in the anode block to reduce the unbalancing effect upon the electrical symmetry within the anode block. The invention provides an improved mechanically and electronically tunable magnetron wherein the mechanical tuning adjustment does not disturb the effectiveness of the modulating electron beam.

What is claimed is:

1. A tunable magnetron comprising a cathode, an anode structure symmetrical about said cathode and forming a plurality of radially-extending anode cavity resonators all in communication with each other in the region of said cathode, and a single tuning cavity resonator of U-shape symmetrically opening at the legs of the U into two of said anode resonators, said tuning resonator having fixed side walls for the legs and a fixed inner wall for the base of the U, the outer wall of the base of the U being formed by a tuning plunger extending between the outer side walls of the legs and movable toward and away from said fixed inner wall.

2. A tunable magnetron comprising a cathode, an anode structure symmetrical about said cathode and forming a plurality of radially-extending anode cavity resonators all in communication with each other in the region of said cathode, a single tuning cavity resonator of U-shape symmetrically opening into two of said anode resonators and including a tuning plunger effective at the middle of said tuning resonator, and means to direct an electron beam thru the middle of said tuning resonator, whereby the effectiveness of said electron beam is not affected by the position of said tuning plunger.

3. A tunable magnetron as defined in claim 2 wherein the length of the path including said two anode resonators and said U-shaped tuning resonator coupled thereto is electrically in the order of one wavelength at the operating frequency.

4. A tunable magnetron comprising, a cathode, an anode structure symmetrical about said cathode and forming a plurality of radially extending anode cavity resonators all in communication with each other in the region of said cathode, a tuning cavity resonator having ends in communication with two of said anode resonators and having a wall in the center portion thereof formed by an adjustable tuning plunger, and means to direct a frequency modulating electron beam thru the center portion of said tuning resonator, whereby the effectiveness of said electron beam in modulating the frequency of said magnetron is not affected by the position of said tuning plunger.

References Cited in the file of this patent

UNITED STATES PATENTS

| | | |
|---|---|---|
| 2,415,253 | Linder | Feb. 4, 1947 |
| 2,466,765 | Hartman | Apr. 12, 1949 |
| 2,493,091 | Sproull | Jan. 3, 1950 |
| 2,589,903 | Vitter | Mar. 18, 1952 |
| 2,611,110 | Powers | Sept. 16, 1952 |

FOREIGN PATENTS

| | | |
|---|---|---|
| 686,499 | Great Britain | Mar. 2, 1951 |